United States Patent [19]
Kato et al.

[11] Patent Number: 5,194,828
[45] Date of Patent: Mar. 16, 1993

[54] DOUBLE PLL DEVICE

[75] Inventors: Hisao Kato; Kanji Mizuno, both of Itami, Japan

[73] Assignee: Mitsubishi Denki Kabushiki Kaisha, Tokyo, Japan

[21] Appl. No.: 788,276

[22] Filed: Nov. 5, 1991

[30] Foreign Application Priority Data

Mar. 29, 1991 [JP] Japan ................................. 3-65769

[51] Int. Cl.[5] .................. H03L 7/095; H03L 7/107; H03L 7/07; H03D 3/24
[52] U.S. Cl. .................................. 331/1 A; 331/2; 331/17; 331/DIG. 2; 375/110; 375/120
[58] Field of Search .................. 331/1 A, 2, 10, 11, 331/17, 18, 23, 25, DIG. 2; 375/94, 97, 120, 110; 329/311, 313

[56] References Cited

U.S. PATENT DOCUMENTS 4,617,520 10/1986 Levine ...................... 331/DIG. 2 X

*Primary Examiner*—David Mis
*Attorney, Agent, or Firm*—Oblon, Spivak, McClelland, Maier & Neustadt

[57] ABSTRACT

In a second PLL circuit 200, a phase comparator 13 compares the phase of a clock B' from a frequency divider 11 with the phase of a clock A' from a first PLL circuit 100 to transmit a comparison result to low pass filters X and Y in a filter circuit 14. A phase shift detector 12 detects a phase shift between the clocks A' and B' to output a detection signal E corresponding to the phase shift. A selector 15 selectively outputs an output of either the low pass filter X or Y in response to the detection signal E to input it to a VCXO 10. When the phase shift between the clocks A' and B' exceeds a predetermined value, the low pass filter Y having a high cut-off frequency is selected, whereby the second PLL circuit 200 responds rapidly, and the clock B' follows the clock A' quickly.

9 Claims, 8 Drawing Sheets

F I G. 7
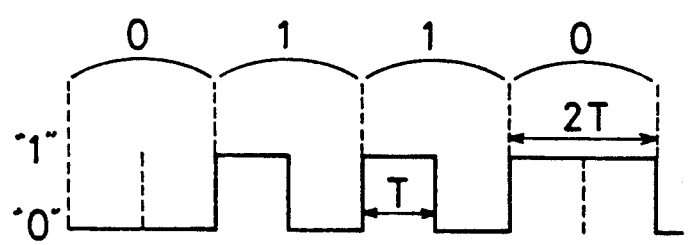

DOUBLE PLL DEVICE

BACKGROUND OF THE INVENTION

1. Field of the Invention

The present invention relates to a double PLL device (hereinafter referred to as a WPLL device) for use in digital audio equipments and the like which require a highly accurate clock signal including less jitters.

2. Description of the Background Art

FIG. 5 is a block diagram of a conventional WPLL device composed of two PLL circuits. A digital audio signal in a digital audio equipment is inputted to a digital signal input terminal 1. The digital audio signal is inputted to a data interface circuit 2 and to a first PLL circuit 100.

The first PLL circuit 100 comprises a voltage controlled oscillator 3 (hereinafter referred to as a "VCO"), frequency dividers 4 and 6, an inversion interval detector 5, a phase comparator 7 and a filter circuit 8.

A clock generated by the VCO 3 is processed by the frequency divider 4, in which a clock A is produced. The clock A is inputted to the data interface circuit 2. The data interface circuit 2 processes the digital audio signal in synchronism with the clock A, and transmits the processed signal to a data interface circuit 9. A clock A', which is produced in the frequency divider 4 by dividing the frequency of the clock generated by the VCO 3 the number of times different from or equal to that for the production of the clock A, is inputted to a second PLL circuit 200.

The digital audio signal from the digital signal input terminal 1 is inputted to the inversion interval detector 5. The inversion interval detector 5 detects whether or not the inversion interval of the digital audio signal from "0" to "1" or from "1" to "0" is a predetermined interval. The frequency divider 6 divides the frequency of the signal from the inversion interval detector 5 to provide a signal having a predetermined frequency. The phase comparator 7 compares the output of the frequency divider 4 with that of the frequency divider 6 and outputs a signal corresponding to a comparison result.

FIG. 6 illustrates an example of the inversion interval detector 5. A change point detector 300 comprises flip-flops 31 and 32 and an exclusive OR circuit 33. The change point detector 300 detects the change point of the digital audio signal from "1" to "0" or from "0" to "0" (an edge of the digital audio signal) and outputs a detection signal K. The detection signal K is inputted to a reset of a counter 34, which is reset in response to the detection signal K. The counter 34 counts the number of clocks I inputted from a clock generator 30 and outputs a 3T detection signal J where the counted number is equal to or more than 24.

The filter circuit 8 is a low pass filter for removing unnecessary frequency bands from the output of the phase comparator 7. The output of the filter circuit 8 is inputted to the VCO 3. The VCO 3 outputs the clock having a frequency corresponding to the output of the filter circuit 8.

The second PLL circuit 200 comprises a voltage controlled crystal oscillator 10 (hereinafter referred to as a "VCXO"), a frequency divider 11, a phase comparator 13 and a filter circuit 17.

The digital audio signal is inputted from the data interface circuit 2 to the data interface circuit 9. A clock generated by the VCXO 10 is processed by the frequency divider 11, in which a clock B is produced. The clock B is inputted to the data interface circuit 9. The digital audio signal from the data interface circuit 2 is triggered by the clock B in the data interface circuit 9 (that is, re-triggered). The data interface circuit 9 transmits the processed signal to another circuit through a digital signal output terminal 16. The clock B is inputted to another circuit such as a D/A converter of one-bit form through a clock output terminal 40.

A clock B' is produced in the frequency divider 11 by dividing the frequency of the clock generated by the VCXO 10 the number of times different from or equal to that for the production of the clock B. The phase comparator 13 compares the phase of the clock A' with that of the clock B' and outputs a signal corresponding to a comparison result. The filter circuit 17 is a low pass filter for removing unnecessary frequency bands from the output of the phase comparator 13. The output of the filter circuit 17 is inputted to the VCXO 10. The VCXO 10 outputs a clock having a frequency corresponding to the output of the filter circuit 17.

The operation of the device is described hereinafter. A digital audio signal produced in accordance with the format provided for by Standard of Electronic Industries Association of Japan (CP-340) is inputted to the digital signal input terminal 1. The Standard of Electronic Industries Association of Japan (CP-340) provides for interfaces of serial system and self-synchronism transmission system which are used for interconnection between digital audio equipments. A serial data transmittable in self-synchronism which is provided for by the Standard of Electronic Industries Association of Japan (CP-340), that is, the digital audio signal inputted to the digital signal input terminal 1 is modulated by a bi-phase mark form. The bi-phase mark form is as follows: The digital audio signal includes a plurality of bits, each of which is composed of two symbols represented respectively by binary numbers. The second symbol of a bit to be transmitted is equal to the first symbol thereof where the bit is "0". The second symbol of the bit is different from the first symbol thereof where the bit is "1". The first symbol of the bit is different from the second symbol of the immediately preceding bit.

FIG. 7 shows an example of the digital audio signal modulated by the bi-phase mark form. It is assumed that the digital audio signal is composed of four bits "0110". The first bit "0" is represented by two binary numbers "0" and "0"; the second bit "1" is represented by two binary numbers "1" and "0"; the third bit "1" is represented by two binary numbers "1" and "0"; and the fourth bit is represented by two binary numbers "1" and "1". The second symbol "0" of the first bit "0" is equal to the first symbol "0" thereof. The first symbol "1" of the second bit "1" is different from the immediately preceding symbol "0" (the second symbol of the first bit "0"). The second symbol "0" of the second bit "1" is different from the first symbol "1" thereof. The first symbol "1" of the third bit "1" is different from the immediately preceding symbol "0" (the second symbol of the second bit "1"). The second symbol "0" of the third bit "1" is different from the first symbol "1" thereof. The first symbol "1" of the fourth bit "0" is different from the immediately preceding symbol "0" (the second symbol of the third bit "1"). The second symbol "1" of the fourth bit "0" is equal to the first symbol "1" thereof. The reference character T shown in FIG. 7 designates a minimum inversion interval.

As shown in FIG. 8, a left-channel preamble in the form of 3T+3T+T+T (8 bits) is inserted in the digital audio signal modulated by the bi-phase mark form for each 28 bit (composed of 16 bits of audio data, 8 bits of auxiliary data and 4 bits of redundant data). The digital audio signal modulated by the bi-phase mark form includes three types of frequencies: T, 2T and 3T. There are preambles other than the aforesaid preamble, for example, a right-channel preamble and a preamble inserted for each block (for each 192 word).

The inversion interval detector 5 detects the period of 3T in the preamble included in the digital audio signal.

A method of detecting 3T is discussed with reference to FIG. 8. The clock generator 30 generates clocks I having a frequency sufficiently higher than the frequency of the digital audio signal. The change point detector 300 composed of the flip-flops 31, 32 and the exclusive OR circuit 33 outputs the change point detection signal K of "0" in synchronism with the edge of the digital audio signal. The counter 34 is reset in synchronism with the signal K of "0". If it is assumed that there are eight clocks I in the minimum inversion interval T, twenty-four clocks are generated in the period of 3T. The counter 34 outputs the 3T detection signal J of "1" where the counted number is equal to or more than 24. Since the preamble is inserted for each 28 bit, the 3T detection signal J is outputted periodically.

The frequency divider 6 performs frequency division on the 3T detection signal J from the inversion interval detector 5 to transmit the processed signal having the predetermined frequency to the phase comparator 7. The phase comparator 7 outputs "0" (or "1") where the phase of the output of the frequency divider 6 leads that of the output of the frequency divider 4, and outputs "1" (or "0") where the phase of the output of the frequency divider 6 lags that of the output of the frequency divider 4.

The filter circuit 8 removes the unnecessary frequency bands (high frequency components) for controlling the VCO 3 from the output of the phase comparator 7 and sends the processed signal to the VCO 3. The VCO 3 oscillates in response to the output of the filter circuit 8, and the oscillation output is processed by the frequency divider 4. The VCO 3, the frequency divider 4, the phase comparator 7 and the filter circuit 8 form a feedback loop. The frequency divider 4 outputs the clock A which is in synchronism with the digital audio signal inputted from the digital signal input terminal 1 and the clock A' which is obtained by performing the frequency division the number of times different from (or equal to) that for the production of the clock A in synchronism with the digital audio signal. The clock A is given to the data interface circuit 2, and the clock A' is given to the phase comparator 13.

The data interface circuit 2 demodulates the modulated digital audio signal in synchronism with the clock A, and separates and controls the redundant data such as parity and category included in the digital audio signal provided for by the Standard of Electronic Industries Association of Japan (CP-340). It inputs only the digital audio data to the data interface circuit 9. The first PLL circuit 100 responds fast to the change in the digital audio signal so that the digital audio signal inputted to the digital signal input terminal 1 can be processed accurately. The clocks A and A' outputed from the first PLL circuit 100 include relatively numerous jitters.

The VCXO 10 receives the output of the filter circuit 17 and oscillates at a frequency corresponding to the output. The VCXO 10 oscillates with a high accuracy approximate to that of a crystal oscillator. The frequency divider 11 receives the output of the VCXO 10, performs the frequency division on the output to provides a predetermined frequency, and inputs the processed signal to the phase comparator 13 as the clock B'. The phase comparator 13 outputs "0" (or "1") where the phase of the clock B' leads that of the clock A', and outputs "1" (or "0") where the phase of the clock B' lags that of the clock A'. The filter circuit 17 removes the unnecessary frequency bands (high frequency components) from the output of the phase comparator 13 and gives the processed signal to the VCXO 10. The VCXO 10, the frequency divider 11, the phase comparator 13 and the filter circuit 17 form a feedback loop. The second PLL circuit 200 generates the clocks B and B' which are in synchronism with the clock A'. The clock B is sent to another circuit through the clock output terminal 40 and to the data interface circuit 9. The digital audio signal from the data interface circuit 2 is triggered by the clock B in the data interface circuit 9 (that is, re-triggered). The data interface circuit 9 outputs the processed signal from the digital audio signal output terminal 16. The clock B is inputted through the clock output terminal 40 to a circuit which requires a high-accuracy clock such as a one-bit DAC (a D/A converter of one-bit form).

The second PLL circuit 200 is adapted to respond slowly to the change in the clock A, that is, in the digital audio signal inputted from the digital signal input terminal 1, in order to ensure the high accuracy of the output clock B. Unlike the clock A, the clock B includes only few jitters.

It is not necessary that the clock A or A' and the clock B or B' are in complete synchronism with each other. A certain phase shift is allowable between the clock A or A' and the clock B or B'. This shift is set in the stage of design to fall in the normally processible range of the digital audio signal in the data interface circuit 9 (that is, within the limit of the system).

The conventional WPLL device has the above-mentioned structure. Since the first PLL circuit 100 must extract the clock elements from the three types of inversion intervals included in the digital audio signal, a high response characteristic is required for the VCO 3. The load fluctuation of the digital audio signal inputted to the digital signal input terminal 1 is constantly found because of various conditions such as a transmission medium and a semiconductor device. Accordingly, the inversion intervals of the digital audio signal are fluctuated. The clock generated by the VCO 3 follows this fluctuation, so that numerous jitters are included in the clock generated by the VCO 3. As a result, the clocks A and A' generated by the frequency divider 4 include numerous jitters.

In the second PLL circuit 200, the frequency divider 11 generates the clock B which triggers the data interface circuit 9, based on the clock A' from the first PLL circuit 100. Since the clocks A and A' are generated through the PLL processing and restricted in fluctuation, such a high response characteristic that the VCO 3 of the first PLL circuit 100 needs is not required for the VCXO 10. Hence, the second PLL circuit 200 generates the highly accurate clocks B and B' including few jitters. The clock B or B' is out of phase slowly (on the order of 1/10 or 1 second) relative to the clock A or A'. When the shift between the phase of the clock B and the phase of the digital audio signal (equal to the phase of the clock A) inputted to the data interface circuit 9 is equal to or larger than the limit of the system, the following problems arise: A normal trigger operation cannot be carried out in the data interface circuit 9 because of out-of-synchronism. Out-of-lock occurs in the second PLL circuit 200. An abnormal digital audio signal is outputted from the digital signal output terminal 16, to cause noises and the like. Another problem is that the out-of-lock in the second PLL circuit 200 changes the phase of the clocks B and B' so that a circuit connected to the clock output terminal 40 and requiring a high-accuracy clock does not operate normally.

SUMMARY OF THE INVENTION

According to the present invention, a double PLL device comprises a first PLL circuit receiving an input signal and producing a first signal in synchronism with the input signal; and a second PLL circuit receiving the first signal and producing a second signal in synchronism with the first signal, the second PLL circuit including a first phase comparator for comparing a phase of the first signal with a phase of the second signal; a first filter for passing only a predetermined frequency component included in a comparison result outputted from the first phase comparator through; a phase shift detector for detecting a phase shift between the first signal and the second signal and outputting a detection result corresponding to the phase shift; cut-off frequency variation means for varying a cut-off frequency of the first filter in response to the detection result of the phase shift detector; and first signal production means receiving an output of the first filter as a control signal and producing the second signal.

The double PLL device of the present invention is provided with the phase shift detector for detecting the phase shift between the first and second signals and outputting the detection result corresponding to the phase shift, and the cut-off frequency variation means for varying the cut-off frequency of the filter in response to the detection result of the phase shift detector. Therefore, the cut-off frequency of the filter can be varied in response to the phase shift between the first and second signals.

As described hereinabove, according to the present invention, the double PLL device is provided with the phase shift detector for detecting the phase shift between the first and second signals and outputting the detection result corresponding to the phase shift, and the cut-off frequency variation means for varying the cut-off frequency of the filter in response to the detection result of the phase shift detector. Therefore, the cut-off frequency of the filter can be varied in response to the phase shift between the first and second signals. When the phase shift between the first and second signals exceeds the predetermined value, the phase shift is corrected before a malfunction by making the second PLL circuit respond fast and making the second signal follow the first signal. When the phase shift between the first and second signals does not exceed the predetermined value, the second PLL circuit is adapted to respond slowly to thereby ensure the high accuracy of the second signal.

An object of the present invention is to provide a WPLL device in which an output clock of a second PLL circuit is not out of phase by a predetermined value or more.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 7 and 8 illustrate a digital audio signal modulated by a bi-phase mark form.

DESCRIPTION OF THE PREFERRED EMBODIMENTS

Figure 1:
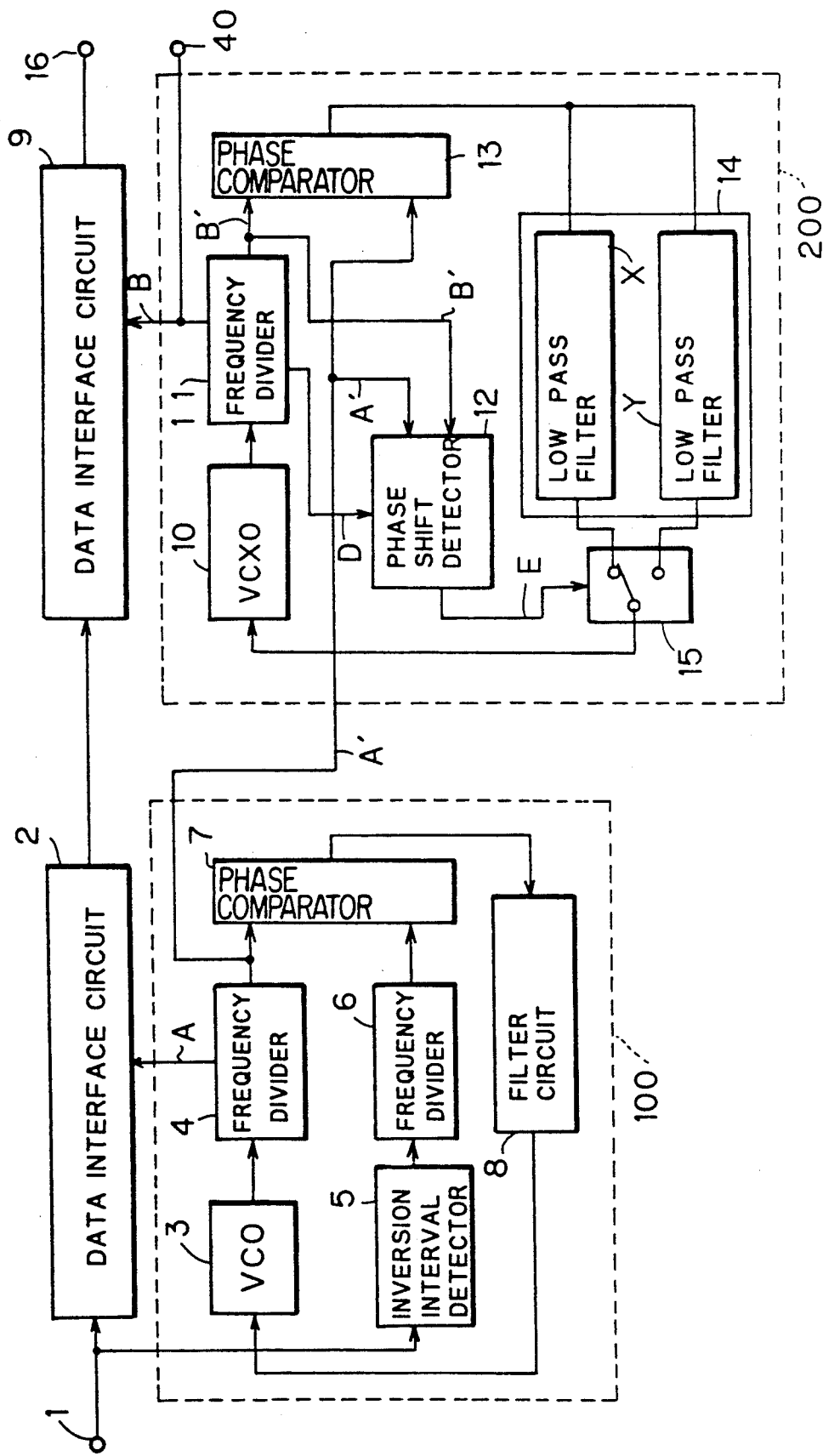
FIG. 1 is a block diagram of a WPLL device according to a preferred embodiment of the present invention.

FIG. 1 is a block diagram of a WPLL device according to the present invention. The WPLL device of FIG. 1 is different from the conventional WPLL device of FIG. 5 in that there is not provided a filter circuit 17 but a phase shift detector 12, a filter circuit 14 and a selector 15 in a second PLL circuit 200. The phase shift detector 12 is supplied with a clock A' from a frequency divider 4, a clock B' from a frequency divider 11, and a clock D generated by the frequency division of the clock outputted from a VCXO 10 for specifying a phase shift detection accuracy. The clock D is outputted from the frequency divider 11. The phase shift detector 12 detects the phase shift between the clocks A and B based on the clock D and outputs a detection signal E corresponding to a detection result.

The filter circuit 14 includes low pass filters X and Y with different cut-off frequency characteristics. The low pass filter X has the same cut-off frequency as the filter circuit 17 employed in the conventional device of FIG. 5. The low pass filter Y has a cut-off frequency higher than that of the low pass filter X. The output of a phase comparator 13 is inputted to the filter circuit 14.

The detection signal E from the phase shift detector 12 and the outputs of the low pass filters X and Y are inputted to the selector 15. The selector 15 selectively sends the output of the low pass filter X or Y to the VCXO 10 in response to the detection signal E. Other structures of the device of FIG. 1 are similar to those of the conventional device of FIG. 5.

Figure 2:
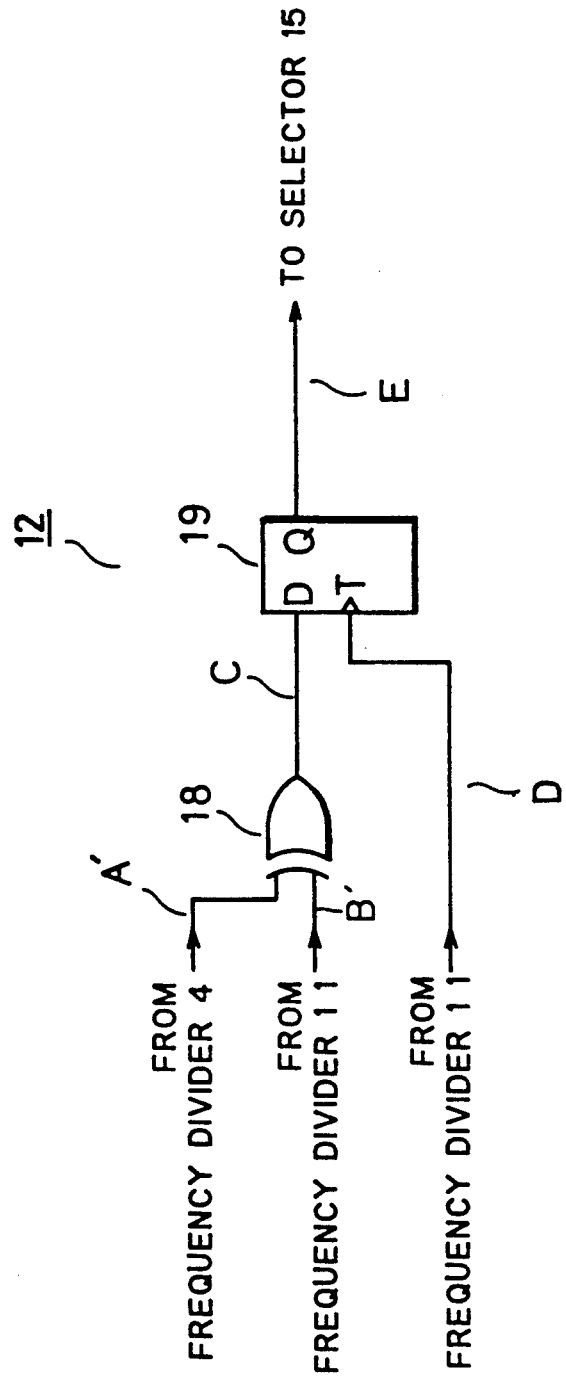
FIG. 2 is a circuit diagram showing an example of a phase shift detector.

FIG. 2 is a circuit diagram showing an example of the phase shift detector 12. The phase shift detector 12 includes an exclusive OR circuit 18 and a D flip-flop 19. The exclusive OR circuit 18 outputs an exclusive OR C of the clocks A' and B'. The output of the exclusive OR circuit 18 and the clock D are inputted to the D flip-flop 19. The D flip-flop 19 latches the exclusive OR C at the rising edge of the clock D and outputs a latched signal as the detection signal E.

The operation of the device is described hereinafter. It is assumed that the WPLL device reaches a critical state close to the limit of the system in which normal signal processing cannot be carried out in the data interface circuit 9 when the phase shift between the clocks A' and B' is 180° or more.

A first PLL circuit 100 in the present invention outputs the clocks A and A' in the same operations as the prior art.

Figure 3:
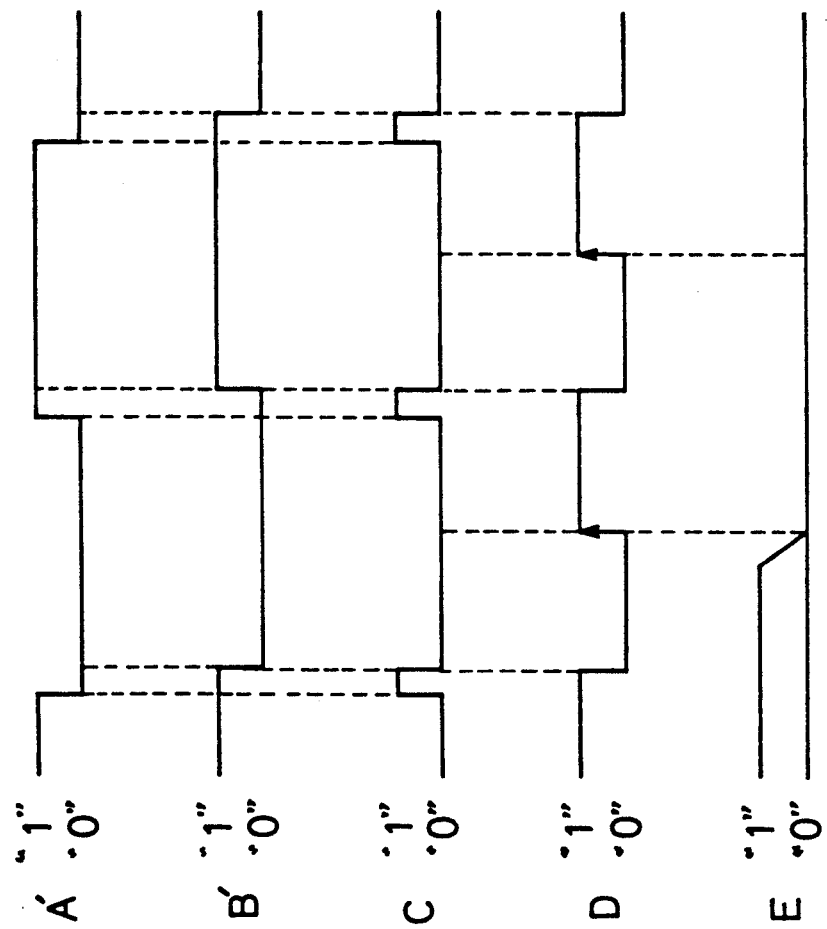
FIGS. 3 and 4 illustrate the operations of the device of FIG. 1.
Figure 4:
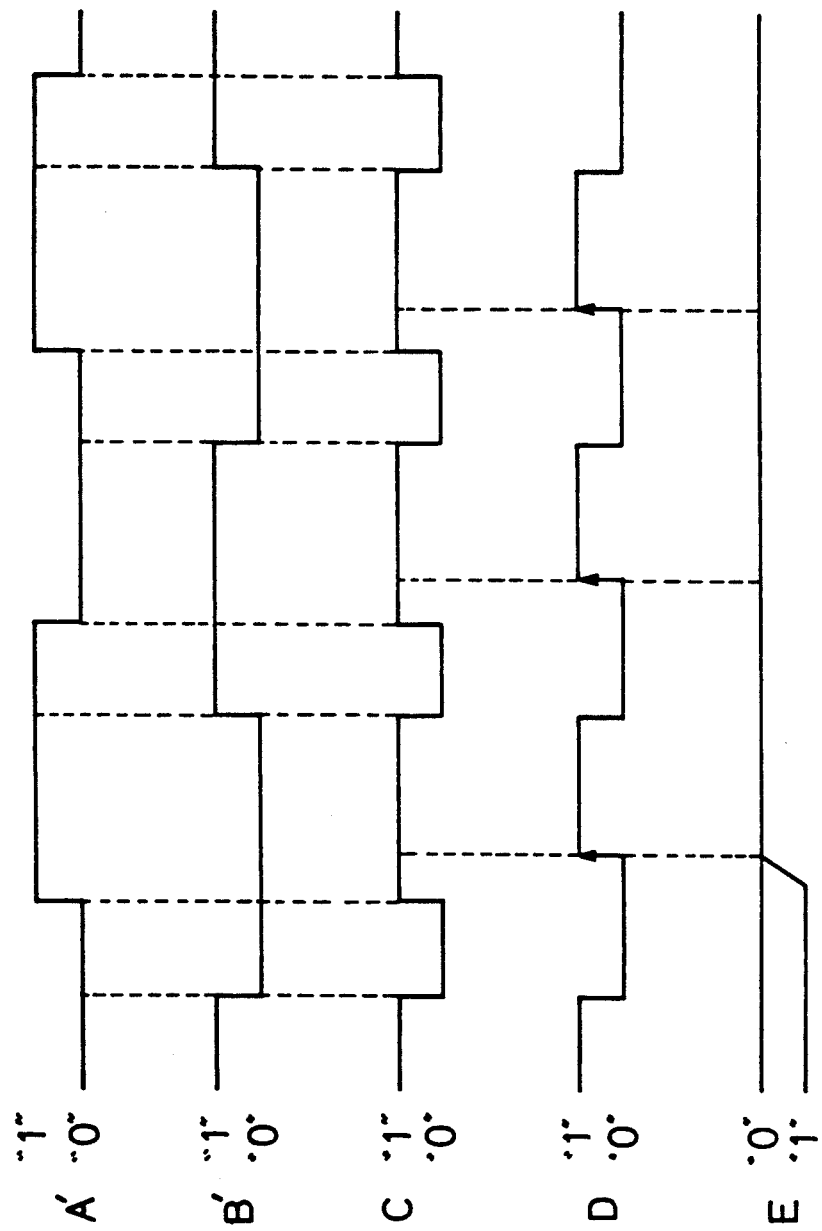

Hereinafter described is the operation of the phase shift detector 12 detecting whether or not the phase shift between the clocks A' and B' is 90° or more, with reference to the waveform charts of FIGS. 3 and 4. The period of the clock D for specifying the phase shift detection accuracy is set to a half of the period of the clock B' in FIGS. 3 and 4. The rising edge (or falling edge) of the clock D corresponds to a 90° phase position of the clock B'. The frequency of the clock A' is assumed to be equal to that of the clock B'.

First, the operation where there is no phase shift between the clocks A' and B' is discussed. The exclusive OR C of the clocks A' and B' is constantly "0", which is inputted to the data input portion of the D flip-flop 19. Since the D flip-flop latches the exclusive OR C ("0") at the rising edge of the clock D in synchronism with the rising edge of the clock D, the detection signal E is constantly "0". In response to the detection signal E of "0", the selector 15 is set to the low pass filter X having a cut-off frequency characteristic for normal operation. The VCXO 10 outputs a clock having a frequency corresponding to the output of the low pass filter X.

Next, the operation where the phase shift between the clocks A' and B' is larger than 0° and smaller than 90° is described. The waveforms of the clock A', the clock B' and the exclusive OR C of the clocks A' and B' are shown in FIG. 3. Because the exclusive OR C is "0" at the rising edge of the clock D, the detection signal E is constantly "0". In response to the detection signal E of "0", the selector 15 is set to the low pass filter X. The VCXO 10 outputs a clock having a frequency corresponding to the output of the low pass filter X having the cut-off frequency characteristic for normal operation.

The operation where the phase shift between the clocks A' and B' is 90° or more is described. The waveform of the exclusive OR C of the clocks A' and B' is shown in FIG. 4. Because the exclusive OR C is "1" at the rising edge of the clock D, the detection signal E is constantly "1". In response to the detection signal E of "1", the selector 15 is set to the low pass filter Y having a cut-off frequency characteristic for abnormal operation. The VCXO 10 outputs a clock having a frequency corresponding to the output of the low pass filter Y.

Figure 5:
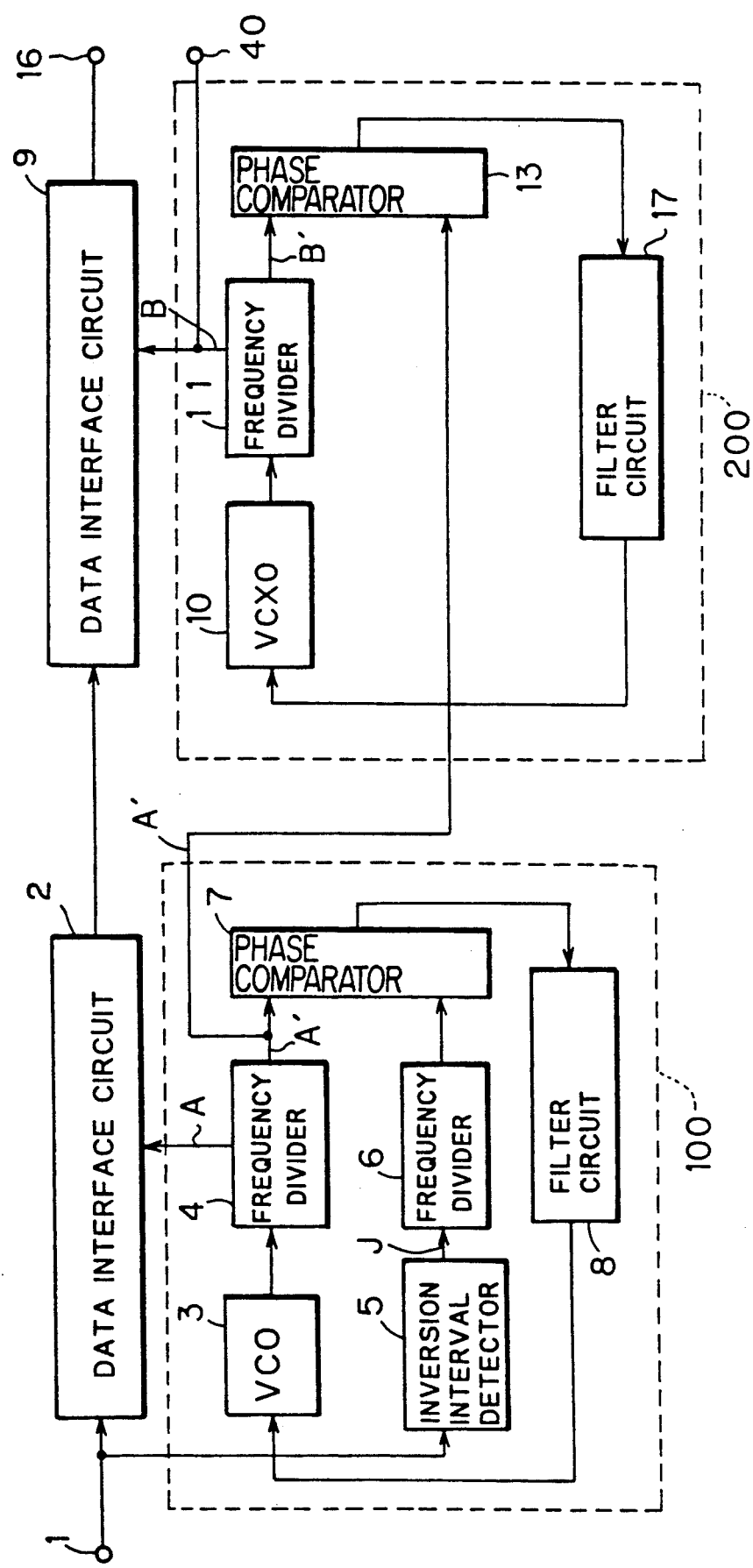
FIG. 5 is a block diagram of a conventional WPLL device.
Figure 6:
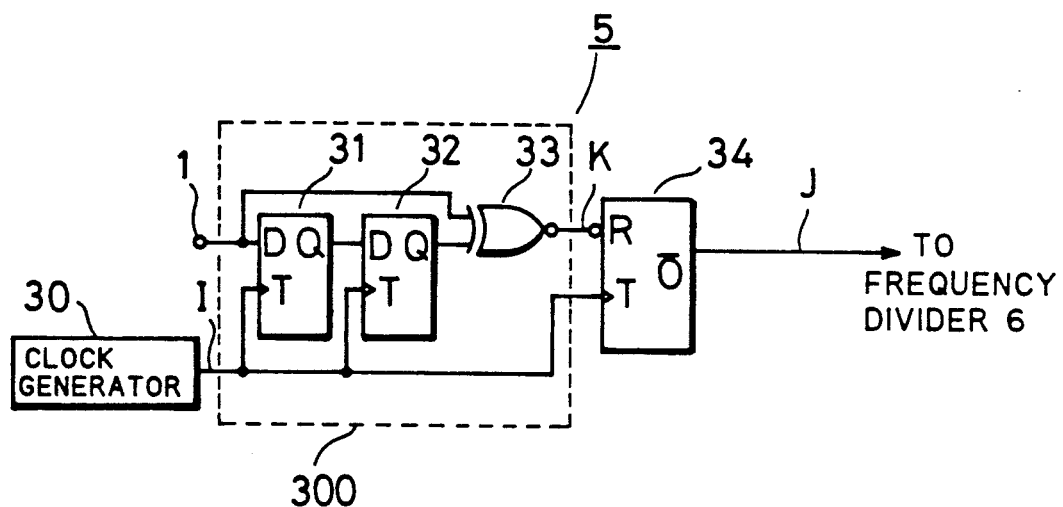
FIG. 6 is a circuit diagram showing an example of a inversion interval detector.
Figure 8:
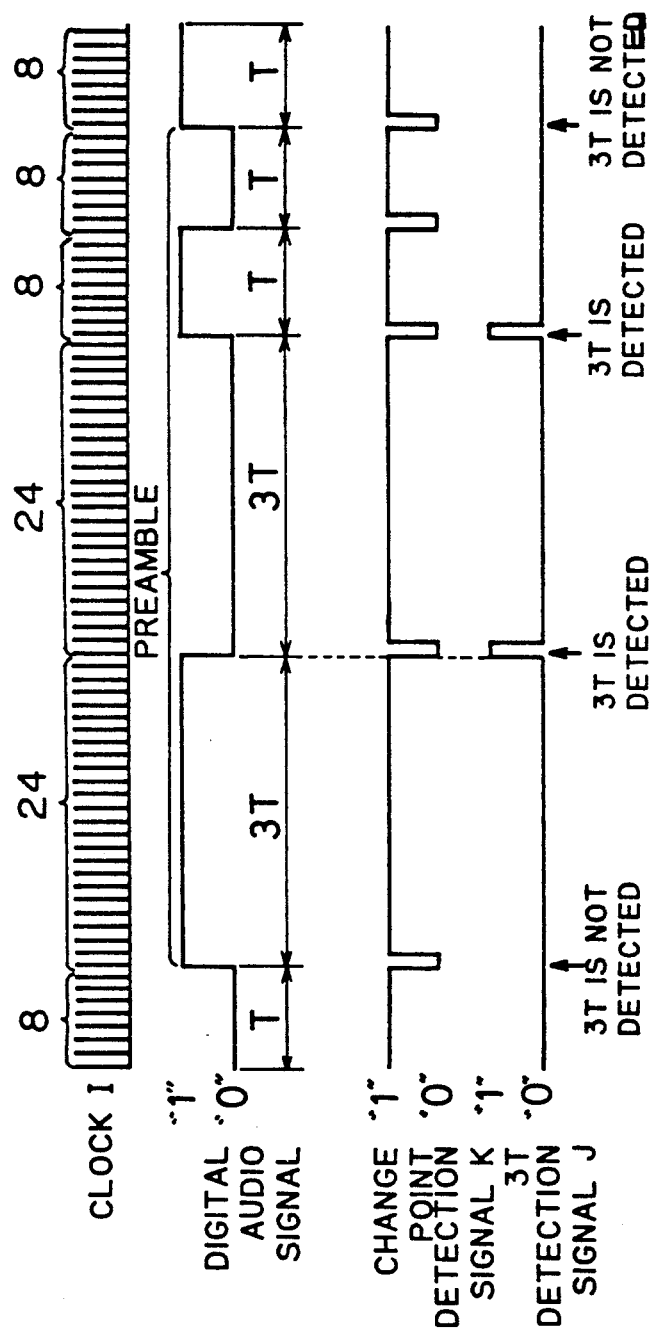

The cut-off frequency of the low pass filter X is for normal operation similarly to that of the filter circuit 17 of the conventional device of FIG. 5. Therefore, the operation where the low pass filter X is selected is similar to the operation in the prior art.

The cut-off frequency of the low pass filter Y is higher than that of the low pass filter X. When the phase shift between the clocks A' and A' is 90° or more, that is, approximate to the limit of the signal processing (where the phase shift between the clocks A' and B' is 180°), the band width of the signal for controlling the VCXO 10 (the output of the filter circuit 14) is enlarged. Thereby, the response of the second PLL circuit 200 is made faster, and the clock B' is made to follow the clock A' rapidly. This prevents the out-of-synchronism of the signals to be processed in the data interface circuit 9 and the out-of-lock in the second PLL circuit 200. When the phase shift between the clocks A' and B' is decreased to be less than 90°, the switch of the selector 15 is set to the low pass filter X, so that the operation similar to the prior art is p carried out.

As described above, when the phase shift between the clocks A' and B' is not less than 90°, the low pass filter Y having the higher cut-off frequency is selected. Therefore, the clock B' is not out of phase by a phase angle much larger than 90° relative to the clock A'. Normal signal processing can be performed in the data interface circuit 9. When the phase shift is less than 90°, the low pass filter X having the relatively low cut-off frequency is selected. Therefore, the high accuracy of the clocks B and B' can be held similarly to the prior art.

In the above-mentioned preferred embodiment, the half period of the clock D is 90°. However, the half period of the clock D may be set to a value slightly smaller than the phase difference between the clocks A' and B' by which normal signal processing cannot be carried out (or the limit of the system).

In the above-mentioned preferred embodiment, the clock D is generated by performing the frequency division on the clock outputted from the VCXO 10. However, it may be generated by performing the frequency division on the clock outputted from the VCO 3. The clock D is not limited to these, only if the phase shift between the clocks A' and B' can be detected. It is not necessary to employ the clock outputted from the VCXO 10 or from the VCO 3 to generated the clock D.

In the above-mentioned preferred embodiment, the frequency of the clock A' is equal to that of the clock B'. However, the frequencies of the clocks are not required to be equal to each other.

While the invention has been shown and described in detail, the foregoing description is in all aspects illustrative and not restrictive. It is therefore understood that numerous modifications and variations can be devised without departing from the scope of the invention.

What is claimed is:

1. A double PLL device comprising:
    a first PLL circuit receiving an input signal and producing a first signal in synchronism with the input signal; and
    a second PLL circuit receiving said first signal and producing a second signal in synchronism with the first signal,
    said second PLL circuit including:
    a first phase comparator for comparing a phase of said first signal with a phase of said second signal;
    a first filter for passing only a predetermined frequency component included in a comparison result outputted from said first phase comparator through;
    a phase shift detector for detecting a phase shift between said first signal and said second signal and outputting a detection result corresponding to the phase shift;
    cut-off frequency variation means for varying a cut-off frequency of said first filter in response to the detection result of said phase shift detector; and
    first signal production means receiving an output of said first filter as a control signal and producing said second signal.

2. A double PLL device as defined in claim 1, wherein said first PLL circuit includes:
    a signal detector for detecting a predetermined signal included in said input signal periodically and outputting a synchronizing signal corresponding to the detection result;
    a second phase comparator for comparing the phase of said first signal and a phase of said synchronizing signal;

a second filter for passing only a predetermined frequency component included in a comparison result outputted from said second phase comparator; and second signal production means receiving an output of said second filter as a control signal and producing said first signal.

3. A double PLL device as defined in claim 1, wherein said cut-frequency variation means includes:

a first low pass filter having a relatively low cut-off frequency, the comparison result outputted from said first phase comparator being inputted to said first low pass filter;

a second low pass filter having a relatively high cut-off frequency, the comparison result outputted from said first phase comparator being inputted to said second low pass filter; and a selector for outputting to said first signal production means an output of either said first or second low pass filter in response to the detection result of said phase shift detector.

4. A double PLL device as defined in claim 3, wherein said phase shift detector includes a circuit for detecting whether or not the phase shift between said first and second signals is a predetermined value or more, and said selector selects said second low pass filter in response to the detection result of said phase shift detector indicating that the phase shift is the predetermined value or more.

5. A double PLL device as defined in claim 1, wherein said first signal production means includes:

a voltage controlled oscillator for oscillating in response to the output of said first filter; and a frequency divider for dividing a frequency of an oscillation output of said voltage controlled oscillator.

6. A double PLL device as defined in claim 2, wherein said second signal production means includes:

a voltage controlled oscillator for oscillating in response to the output of said second filter; and a frequency divider for dividing a frequency of an oscillation output of said voltage controlled oscillator.

7. A double PLL device as defined in claim 1, wherein said input signal is a digital signal and said first and second signals are digital signals in synchronism with said input signal.

8. A double PLL device as defined in claim 1, wherein said second PLL circuit further includes clock generation means for generating a clock having a frequency higher than frequencies of said first and second signals, and said phase shift detector includes:

an exclusive OR circuit for outputting an exclusive OR of said first and second signals; and a D flip-flop receiving said clock and an output of said exclusive OR circuit and latching the output of said exclusive OR circuit at rising edge of said clock in synchronism with the rising of said clock.

9. A double PLL device, comprising:

a first PLL circuit receiving an input signal and producing a first signal in synchronism with the input signal; and a second PLL circuit receiving said first signal and producing a second signal in synchronism with the first signal, said second PLL circuit including:

a first phase comparator for comparing a phase of said first signal with a phase of said second signal;

a first filter for passing only a predetermined frequency component included in a comparison result outputted from said first phase comparator through;

a phase shift detector for detecting a phase shift between said first signal and said second signal and outputting a detection result corresponding to the phase shift;

cut-off frequency variation means for varying a cut-off frequency of said first filter in response to the detection result of said phase shift detector; and first signal production means receiving an output of said first filter as a control signal and producing said second signal;

a first signal processor for processing said input signal in synchronism with said first signal; and a second signal processor receiving an output of said first signal processor for processing the output of said first signal processor in synchronism with said second signal.

* * * * *